United States Patent
Matsushita et al.

(10) Patent No.: US 9,964,358 B2
(45) Date of Patent: May 8, 2018

(54) SUBSTRATE PROCESSING APPARATUS AND SUBSTRATE PROCESSING METHOD

(71) Applicant: SHIBAURA MECHATRONICS CORPORATION, Yokohama-shi, Kanagawa (JP)

(72) Inventors: Jun Matsushita, Yokohama (JP); Takashi Miyamoto, Yokohama (JP); Konosuke Hayashi, Yokohama (JP); Osamu Yamazaki, Yokohama (JP)

(73) Assignee: SHIBAURA MECHATRONICS CORPORATION, Kanagawa (JP)

( * ) Notice: Subject to any disclaimer, the term of this patent is extended or adjusted under 35 U.S.C. 154(b) by 0 days. days.

(21) Appl. No.: 15/141,946

(22) Filed: Apr. 29, 2016

(65) Prior Publication Data

US 2016/0322241 A1    Nov. 3, 2016

(30) Foreign Application Priority Data

Apr. 30, 2015   (JP) .................................. 2015-093549
Mar. 24, 2016   (JP) .................................. 2016-059818

(51) Int. Cl.
*F26B 3/30* (2006.01)
*H01L 21/67* (2006.01)

(52) U.S. Cl.
CPC .......... *F26B 3/30* (2013.01); *H01L 21/67115* (2013.01)

(58) Field of Classification Search
CPC .... F26B 3/00; F26B 3/30; F26B 21/00; F26B 21/06; H01L 21/67115; H01L 21/67034; H01L 21/68785

USPC .............................................. 34/273, 397, 78
See application file for complete search history.

(56) References Cited

U.S. PATENT DOCUMENTS

| | | | | |
|---|---|---|---|---|
| 5,671,544 A | * | 9/1997 | Yokomizo | F26B 21/145 34/169 |
| 5,950,328 A | * | 9/1999 | Ichiko | H01L 21/67034 34/364 |
| 6,059,922 A | * | 5/2000 | Yamazaki | H05H 1/00 118/723 ME |

(Continued)

FOREIGN PATENT DOCUMENTS

FR    2815395 A1 *  4/2002    ........ H01L 21/67115
JP    2004511907 A     4/2004

(Continued)

OTHER PUBLICATIONS

Office Action issued in corresponding Korean Patent Application No. 10-2016-0052341 dated Jun. 29, 2017, consisting of 14 pp. (English Translation Provided).

*Primary Examiner* — Stephen M Gravini
(74) *Attorney, Agent, or Firm* — Volpe and Koenig, P.C.

(57) ABSTRACT

The substrate processing unit 1 comprises the rotating table 31 configured to hold substrate W, the processing chamber 37 which accommodates the rotating table 31, a lamp 61 is provided above the processing chamber 37 and configured to heat the surface of substrate W, the lamp chamber 60 which accommodates that lamp 61, a transmission window 62 disposed below the lamp chamber 60, and a plurality of nozzle 64 which supply cooling fluid G to the transmission window 62. Then the substrate processing unit 1 can suppress generating of a water mark or pattern collapse, and can perform good substrate processing.

10 Claims, 14 Drawing Sheets

(56) References Cited

U.S. PATENT DOCUMENTS

| | | | | |
|---|---|---|---|---|
| 6,128,830 A * | 10/2000 | Bettcher | ............ | H01L 21/67034 134/2 |
| 6,134,807 A * | 10/2000 | Komino | ............ | H01L 21/67034 34/418 |
| 6,170,169 B1 * | 1/2001 | Weber | ............ | F26B 3/28 34/189 |
| 6,333,246 B1 * | 12/2001 | Narita | ............ | C23C 16/4401 257/E21.252 |
| 6,727,474 B2 * | 4/2004 | Gat | ............ | H01L 21/67115 118/724 |
| 6,759,632 B2 * | 7/2004 | Ducret | ............ | H01L 21/67115 219/390 |
| 7,089,686 B2 * | 8/2006 | Lange | ............ | B05D 3/067 34/278 |
| 7,098,157 B2 * | 8/2006 | Funk | ............ | H01L 21/67115 34/413 |
| 7,437,834 B2 * | 10/2008 | Nakatsukasa | ..... | H01L 21/02052 34/381 |
| 7,644,512 B1 * | 1/2010 | Liu | ............ | C11D 11/0041 118/65 |
| 7,654,010 B2 * | 2/2010 | Moriya | ............ | H01L 21/67017 118/65 |
| 7,797,855 B2 * | 9/2010 | Fukuoka | ............ | C30B 33/02 118/709 |
| 8,701,308 B2 * | 4/2014 | Hiroshiro | ............ | H05B 3/0052 118/723 E |
| 9,275,847 B2 * | 3/2016 | Jung | ............ | H01L 21/00 |
| 9,349,620 B2 * | 5/2016 | Kamata | ............ | H01L 21/67775 |
| 9,513,053 B2 * | 12/2016 | Zielinski | ............ | F26B 5/04 |
| 9,536,797 B2 * | 1/2017 | Igarashi | ............ | H01L 22/12 |
| 2011/0253043 A1 | 10/2011 | Kim | | |
| 2015/0075748 A1 | 3/2015 | Suzuki | | |
| 2015/0090296 A1 * | 4/2015 | Nagashima | ............ | B08B 3/10 134/19 |
| 2016/0025410 A1 * | 1/2016 | Igarashi | ............ | H01L 22/26 34/404 |
| 2016/0322241 A1 * | 11/2016 | Matsushita | ............ | F26B 3/30 |

FOREIGN PATENT DOCUMENTS

| | | |
|---|---|---|
| JP | 2015-029041 A | 2/2015 |
| KR | 2011-0116522 A | 10/2011 |
| KR | 2015-0031182 A | 3/2015 |

* cited by examiner

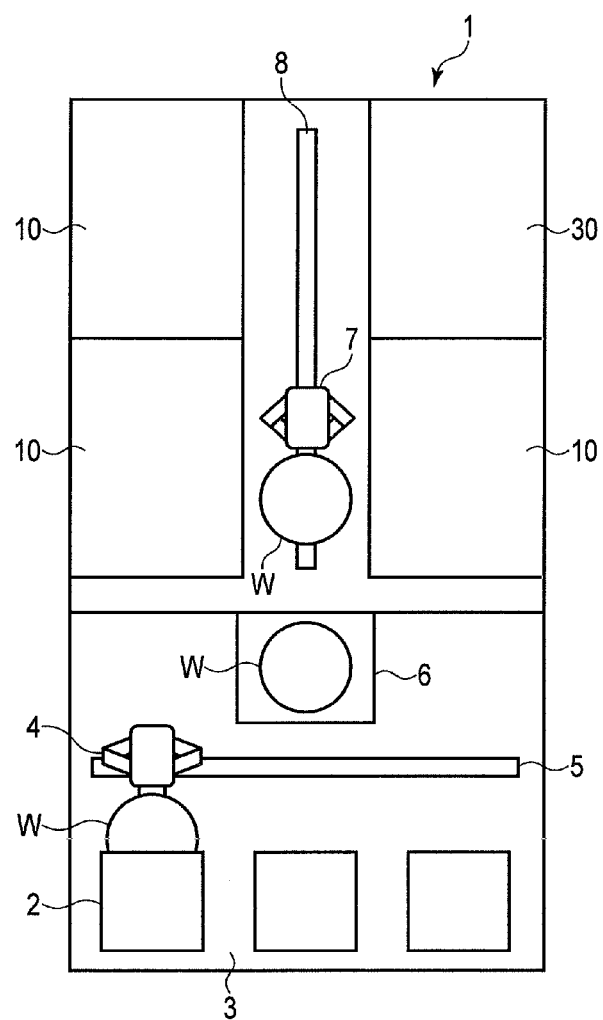
F I G. 1

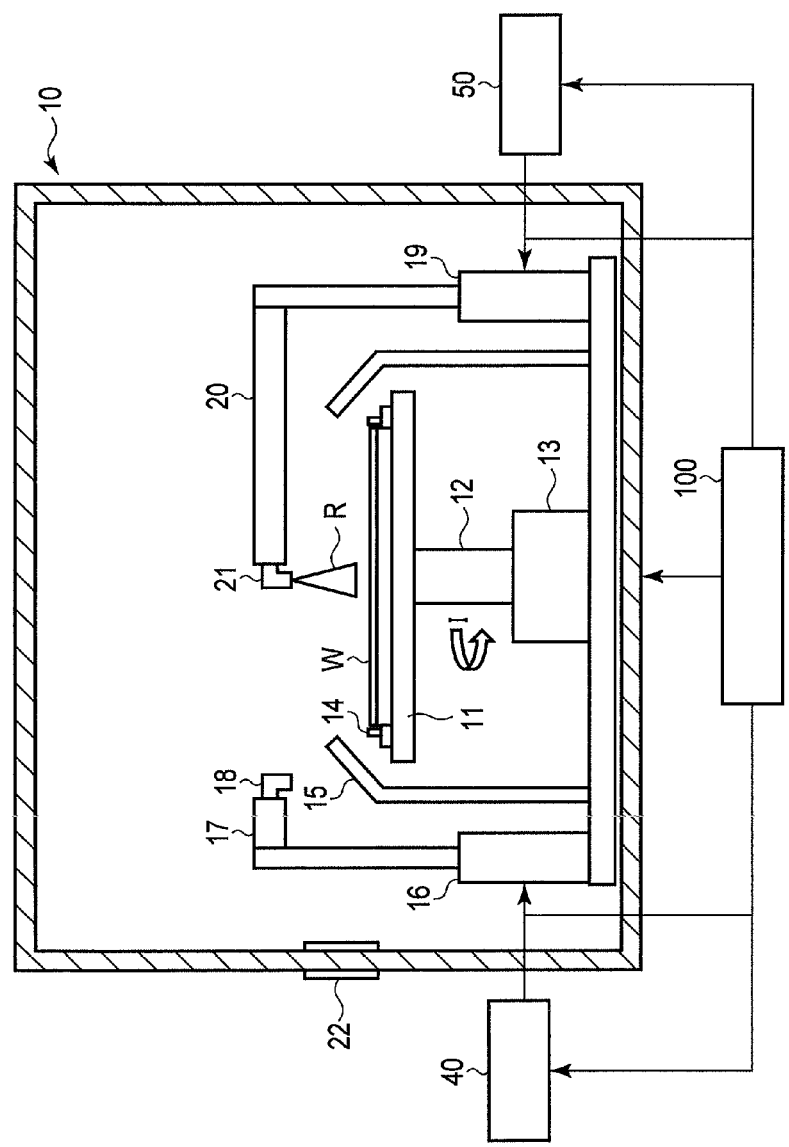
F I G. 2

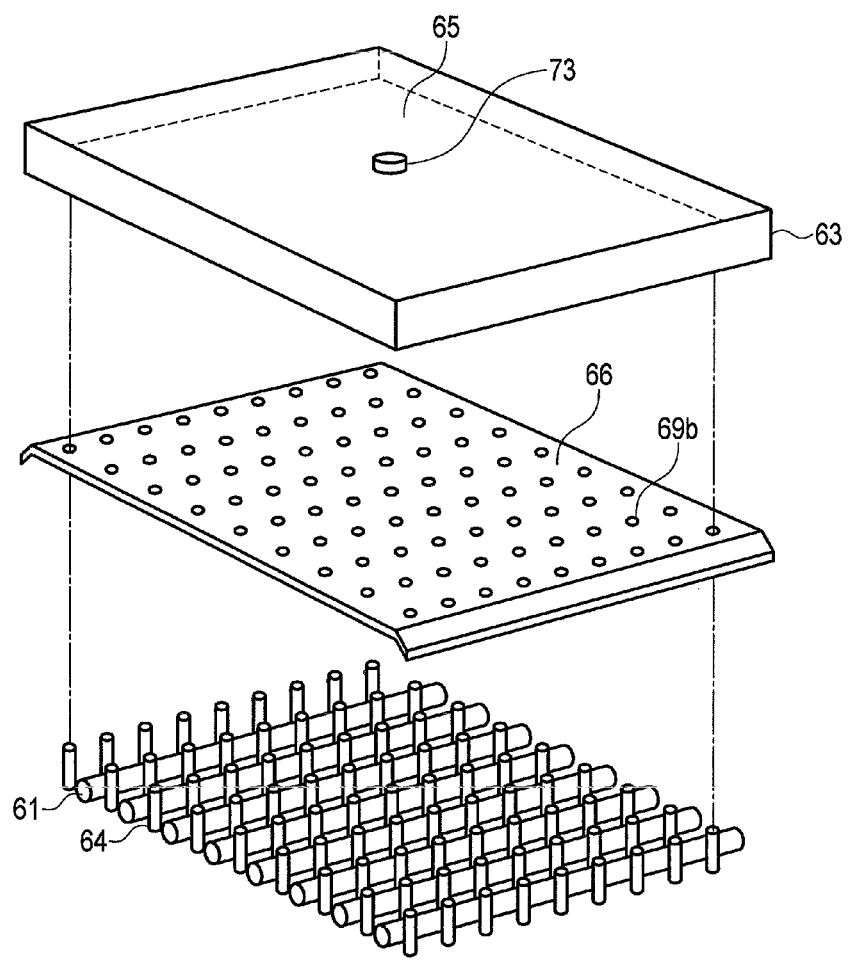
F I G. 5

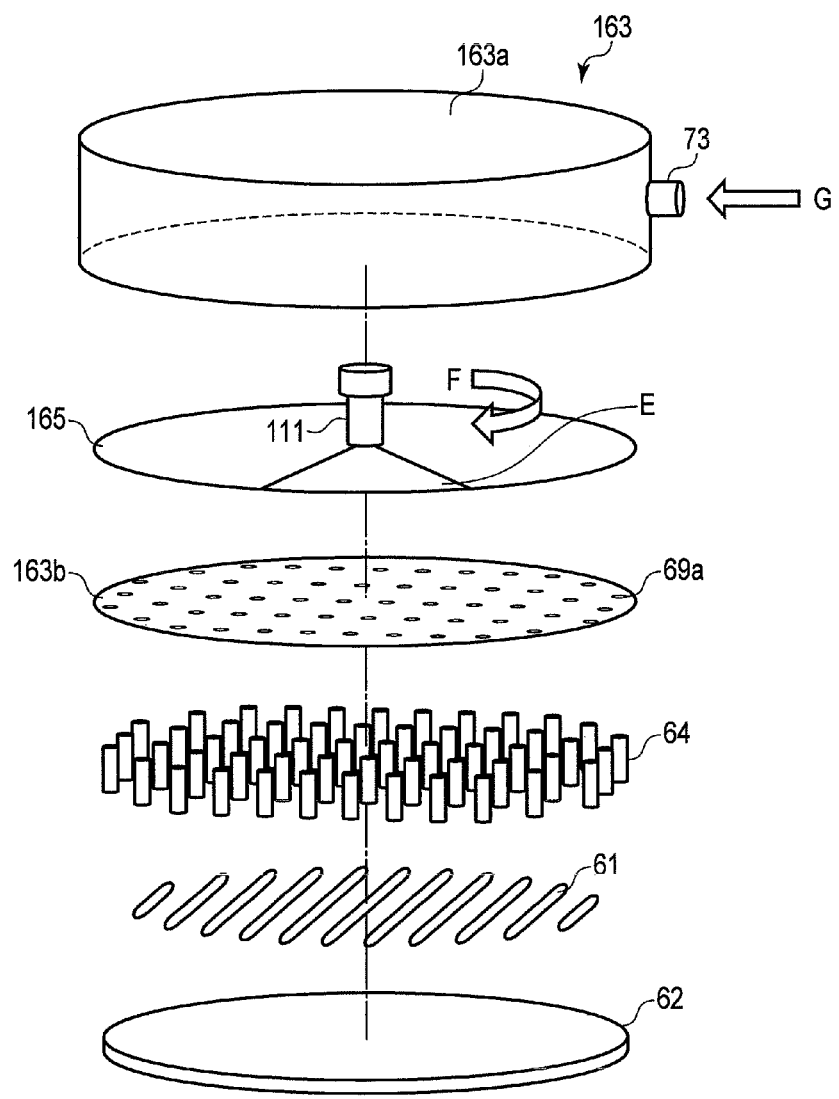
F I G. 7

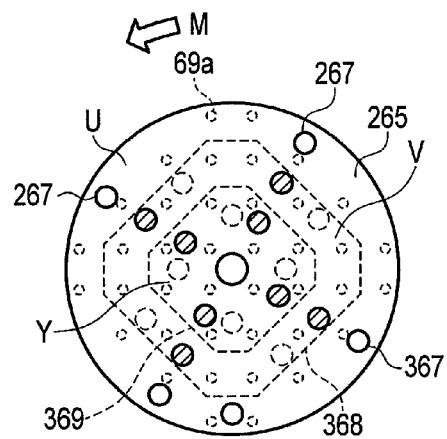
F I G. 12A
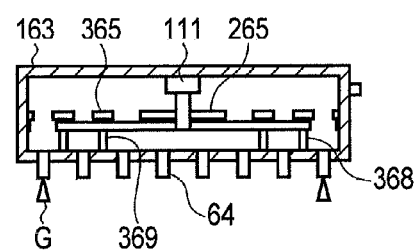
F I G. 12B

SUBSTRATE PROCESSING APPARATUS AND SUBSTRATE PROCESSING METHOD

CROSS-REFERENCE TO RELATED APPLICATIONS

This application is based upon and claims the benefit of priority from the prior Japanese Patent Applications No. 2015-093549, filed Apr. 30, 2015, and No. 2016-059818, filed Mar. 24, 2016, the entire contents both of which is incorporated herein by reference.

BACKGROUND OF THE INVENTION

1. Field of the Invention

Embodiments of the present invention relate to a substrate processing apparatus and a substrate processing method.

2. Description of the Related Art

A substrate processing apparatus is an apparatus which supplies a processing solution to a surface of a substrate such as a wafer or a liquid crystal substrate, for example, to clean the surface of the substrate in a process of manufacturing a semiconductor, and then dries the surface of the substrate.

Incidentally, in recent years, semiconductors have progressed in terms of miniaturization of their patterns along with their increased integration and capacity. Therefore, there occurs a problem, for example, in that the patterns in the vicinity of a memory cell and a gate collapse in the drying process using the above-described substrate processing apparatus. This problem is caused by an interval between the patterns, a structure, and a surface tension of the processing solution.

Therefore, for the purpose of suppressing the above-described collapse of the patterns, there is disclosed a substrate drying apparatus using a halogen lamp (for example, Jpn. Pat. Appln. KOKAI Publication No. 2015-29041), in which IPA is formed in a liquid ball shape on the surface of the substrate and the substrate is dried by removing the liquid ball.

According to such a processing method using the substrate drying apparatus, the pattern collapse is suppressed, and a dry processing can be desirably performed. Incidentally, a transmission window is also disposed between the heating unit and the substrate in order to protect a heating unit such as the halogen lamp from the processing solution. In this case, as a matter of course, the transmission window is also heated by the heating unit. When the temperature of the transmission window enters a high temperature state as the process is repeatedly performed, the surface of the substrate is unevenly dried at the time when the substrate is carried into a dry processing chamber. Further, it has been found out that a water mark (water stain) and a pattern collapse are caused by the uneven drying.

BRIEF SUMMARY OF THE INVENTION

The present invention has been made in view of the above problem, and an object is to provide a substrate processing apparatus and a substrate processing method which suppress the water mark and the pattern collapse and desirably processes the substrate.

A substrate processing apparatus according to an embodiment is a substrate processing apparatus to which a processing solution is supplied, including: a chamber; a holding unit which is provided in the chamber and holds a substrate; a heating unit which heats the substrate held by the holding unit; a transmission window which is provided to face the heating unit, and transmits the light emitted from the heating unit; a cooling unit which cools down the transmission window using a cooling fluid; and a control unit which operates the cooling unit when the heating unit does not perform the heating.

A substrate processing method according to an embodiment is a substrate processing method of supplying a processing solution to a surface of a substrate, including: holding the substrate which is contained in a chamber; heating the substrate, the substrate being held in the chamber, through a transmission window; and cooling down the transmission window using a cooling fluid when the heating of the substrate is not performed.

BRIEF DESCRIPTION OF THE SEVERAL VIEWS OF THE DRAWING

FIG. 1 is a plan view schematically illustrating the entire configuration of a substrate processing apparatus according to a first embodiment;

FIG. 2 is a cross-sectional view schematically illustrating a configuration of a processing chamber of the substrate processing apparatus according to the first embodiment;

FIG. 5 is an exploded perspective view for describing a layout of the heating unit and the cooling unit in the dry processing chamber of the substrate processing apparatus according to the first embodiment;

FIG. 7 is an exploded perspective view schematically illustrating a configuration of a buffer unit of a substrate processing apparatus according to a second embodiment;

FIG. 12A is a plan view illustrating a configuration in the buffer unit of the substrate processing apparatus according to the third embodiment;

FIG. 12B is a cross-sectional view illustrating a configuration in the buffer unit of the substrate processing apparatus according to the third embodiment;

DETAILED DESCRIPTION OF THE INVENTION

First Embodiment

Figure 3:
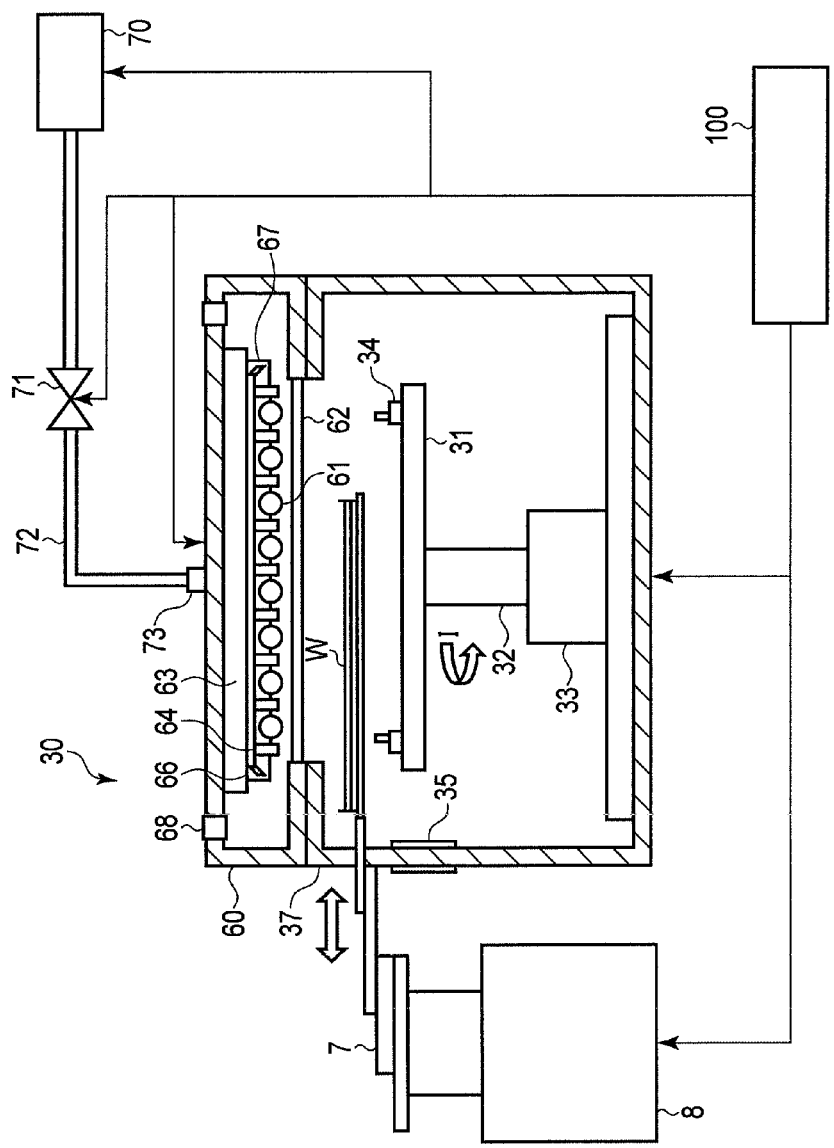
FIG. 3 is a cross-sectional view schematically illustrating a configuration of a dry processing chamber of the substrate processing apparatus according to the first embodiment.

As illustrated in FIG. 1, a substrate processing apparatus 1 according to a first embodiment includes a FOUP 2 in which an unprocessed substrate W is stored, a FOUP placing table 3 on which the FOUP 2 is placed, a conveyance robot 4 which takes out the unprocessed substrate W stored in the FOUP 2, a conveyance rail 5 on which the conveyance robot 4 moves, a substrate placing table 6 on which the substrate W conveyed by the conveyance robot 4 is placed, a conveyance robot 7 which conveys the substrate W placed on the substrate placing table 6 to a processing chamber 10 and a dry processing chamber 30 described below, a conveyance rail 8 on which the conveyance robot 7 moves, the processing chamber 10 which performs a process using a processing solution, and the dry processing chamber 30 which is used for performing a dry processing on the substrate W processed by the processing chamber 10.

FIG. 2 illustrates a configuration of the processing chamber 10. In the processing chamber 10, there is a rotation table 11 serving as a holding unit which horizontally holds the substrate W. The rotation table 11 is connected to a rotation shaft 12 and a motor 13. Further, the rotation table 11 is configured to be rotated in accordance with a rotating operation of the motor 13. The motor 13 is electrically connected to a control unit 100, and rotated in a direction of arrow I illustrated in FIG. 2 at a rotation frequency set by a command from the control unit 100. A holding pin 14 is configured to eccentrically rotate (not illustrated). While eccentrically rotating, the holding pin 14 abuts on the end portion of the substrate W carried into the processing chamber 10 so as to hold the substrate.

A cup 15 serves to collect the processing solution supplied to a processing surface of the substrate W which is rotated by the rotation table 11, and to guide the collected processing solution to a discharge pipe (not illustrated). Further, the cup 15 may have a double structure to separately collect the processing solution.

An arm driving mechanism 16 rotates and drives a swinging arm 17. Further, the arm driving mechanism 16 is electrically connected to the control unit 100, and drives the swinging arm 17 according to a program installed in the control unit 100.

A processing solution discharge nozzle 18 is connected to the tip of the swinging arm 17, and can move in the horizontal direction above the substrate W as the arm driving mechanism 16 is operated. The processing solution is discharged onto the surface of the substrate W by the processing solution discharge nozzle 18, and can process the surface of the substrate W. At the time of processing the substrate W, the processing solution discharge nozzle 18 is horizontally moved toward the center of the substrate W from a standby position by the operation of the arm driving mechanism 16. Further, the processing solution discharge nozzle 18 is connected to a processing solution supply pipe (not illustrated) from a processing solution supply unit 40 through the arm driving mechanism 16 and the swinging arm 17. In addition, a valve (not illustrated) is provided in the middle of the processing solution supply pipe. The valve and the processing solution supply unit 40 are electrically connected to the control unit 100. The control unit 100 controls the processing solution supply unit 40 and the valve to supply the processing solution to the processing solution discharge nozzle 18. As the processing solution, an etching solution, a cleaning solution, or the like (APM, SC-1) is used.

An arm driving mechanism 19 is connected to rotate and drive a swinging arm 20. Further, the arm driving mechanism 19 is electrically connected to the control unit 100, and driven by a program installed in the control unit 100.

A rinse solution discharge nozzle 21 is connected to the tip of the swinging arm 20, and can move in the horizontal direction above the substrate W as the arm driving mechanism 19 is operated. A rinse solution R is discharged onto the surface of the substrate W by the rinse solution discharge nozzle 21, and can be run together with the processing solution which remains on the surface of the substrate W and is discharged by the processing solution discharge nozzle 18. Further, the rinse solution discharge nozzle 21 is connected to a rinse solution supply pipe (not illustrated) from a rinse solution supply unit 50 through the arm driving mechanism 19 and the swinging arm 20. In addition, a valve (not illustrated) is provided in the middle of the rinse solution supply pipe. The valve and the rinse solution supply unit 50 each are electrically connected to the control unit 100. The control unit 100 controls the rinse solution supply unit 50 and the valve to supply the rinse solution R to the rinse solution discharge nozzle 21. As the rinse solution R, ultrapure water is used. Further, isopropyl alcohol (IPA) may be used as the rinse solution R besides ultrapure water, and there may be provided a nozzle or a supply source to discharge the IPA besides the rinse solution discharge nozzle 21.

A conveyance door 22 opens or closes a receiving entrance in order for the conveyance robot 7 to carry the substrate W into the rotation table 11. The conveyance door 22 is elevated by an elevating mechanism (not illustrated) so as to perform an open/close operation. In other words, when the conveyance door 22 is lowered by the operation of the elevating mechanism, the conveyance robot 7 can carry the substrate W in and out with respect to the processing chamber 10. The elevating mechanism is electrically connected to the control unit 100, and the elevating operation thereof is controlled by the control unit 100.

FIG. 3 illustrates a configuration of the dry processing chamber 30. The dry processing chamber 30 is configured by a lamp chamber 60 which contains a lamp 61 as a dry unit and a processing chamber 37 which processes the substrate. In the processing chamber 37, there is a rotation table 31 serving as a holding unit which horizontally holds the substrate W. The rotation table 31 is connected to a rotation shaft 32 and a motor 33, and is configured to be rotated in accordance with a rotating operation of the motor 33. The motor 33 is electrically connected to the control unit 100, and rotated in a direction of arrow I illustrated in FIG. 3 at a rotation frequency set by a command from the control unit 100. A holding pin 34 is configured to eccentrically rotate (not illustrated). While eccentrically rotating, the holding pin 34 abuts on the end portion of the substrate W carried into the dry processing chamber 30 so as to hold the substrate.

A conveyance door 35 opens or closes a receiving entrance in order for the conveyance robot 7 to carry the substrate W into the rotation table 31. The conveyance door 35 is provided to be elevated by an elevating mechanism (not illustrated) so as to perform an open/close operation of the receiving entrance. In other words, when the conveyance door 35 is lowered, the conveyance robot 7 can carry the substrate W in and out with respect to the processing chamber 37. The elevating mechanism is electrically connected to the control unit 100, and the elevating operation thereof is controlled by the control unit 100.

The lamp chamber 60 is provided above the processing chamber 37. In the lamp chamber 60, the lamp 61 serving as a heating unit, a plurality of nozzles 64 serving as a cooling unit (a cooling fluid injection unit), and a buffer unit 63 are provided.

The lamp 61 emits light to the surface of the substrate W on the rotation table 31. The lamp 61 is electrically connected to the control unit 100. A lighting control of the lamp is performed by the control unit 100. Herein, as the lamp 61, for example, a plurality of lamps 61 of a linear tube type may be provided in parallel at a predetermined interval, or in an array shape (a matrix shape). In addition, as the lamp 61, for example, a halogen lamp, a xenon flash lamp (for example, a flash lamp having a wavelength of 400 to 1000 nm), or a far-infrared heater may be used.

A transmission window 62 which transmits the light emitted from the lamp 61 is provided between the processing chamber 37 and the lamp chamber 60. The transmission window 62 is disposed immediately below the lamp 61, and is provided to be supported by the lamp chamber 60. In addition, the transmission window 62 serves to prevent particles (metallic waste) from being attached to the surface of the substrate W from the lamp chamber 60. In this embodiment, a window made of quartz is used as the transmission window 62, but the invention is not limited to quartz and any member may be used as long as the material transmits light.

Figure 4:
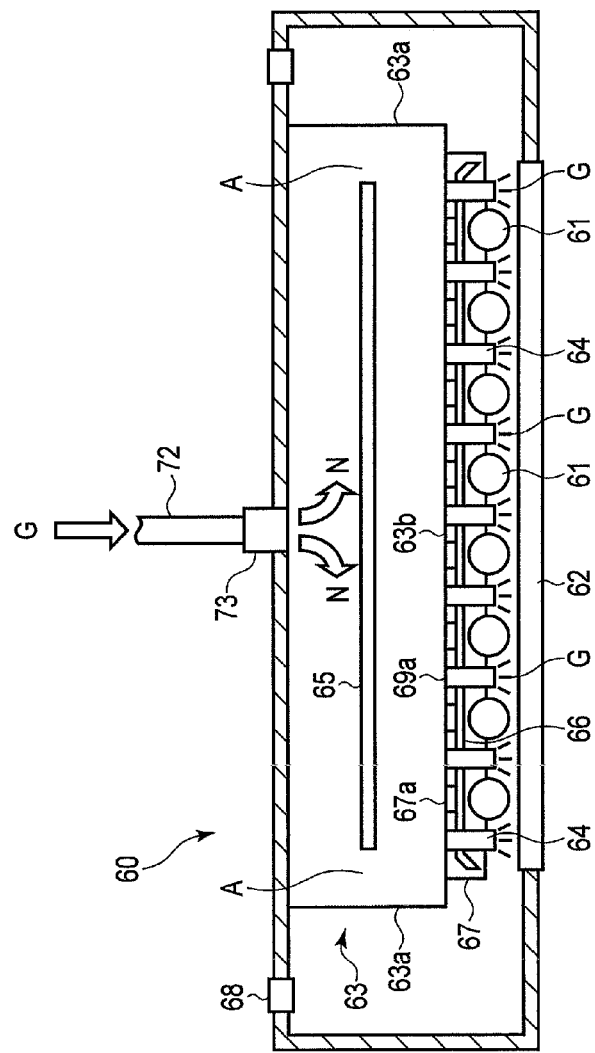
FIG. 4 is a cross-sectional view schematically illustrating a configuration of a heating unit and a cooling unit of the dry processing chamber of the substrate processing apparatus according to the first embodiment.
Figure 6:
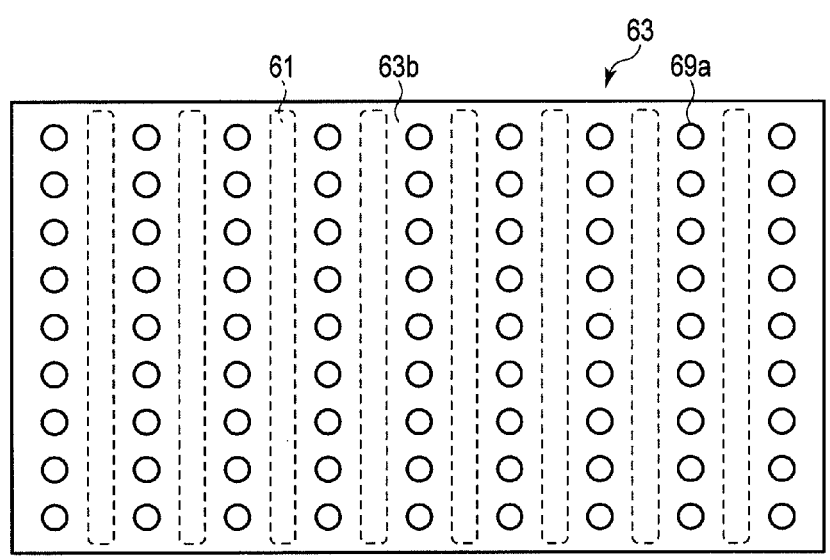
FIG. 6 is a plan view for describing a layout of the heating unit and the cooling unit in the dry processing chamber of the substrate processing apparatus according to the first embodiment.

As illustrated in FIGS. 3 and 4, the buffer unit 63 is formed in a box shape, and connected to a cooling fluid supply unit 70, a pipe 72, and a supply port 73. As the cooling fluid G, for example, air or a nitrogen gas can be supplied from the cooling fluid supply unit 70 into the buffer unit 63 through the pipe 72 as depicted by arrow N. Further, a valve 71 is interposed in the middle of the pipe 72. As illustrated in FIG. 6, a bottom 63b of the buffer unit 63 is provided with a plurality of supply ports 69a respectively corresponding to the plurality of nozzles 64. The supply port 69a and the nozzle 64 are bonded in order to prevent leakage of the cooling fluid G.

As illustrated in FIG. 4, a partition plate 65 is provided in the buffer unit 63. The length of the partition plate 65 in the horizontal direction is set to be shorter than that of the buffer unit 63 in the horizontal direction. Therefore, gaps A are formed between both ends of the partition plate 65 and a side wall, surface 63a of the buffer unit 63.

The plurality of nozzles 64 are provided in the bottom 63b of the buffer unit 63, and fixed thereto to correspond to the plurality of supply ports 69a. The plurality of nozzles 64 are disposed such that plural nozzles are placed in a gap between each pair of the plurality of lamps 61 which are disposed at a predetermined interval. In addition, each nozzle 64 is provided to supply the cooling fluid G sent from the cooling fluid supply unit 70 toward the transmission window 62 (see FIG. 3). Each nozzle 64 is made of a material (for example, aluminum) which does not transmit light from the lamp 61. Further, an outlet of each nozzle 64 faces the transmission window 62, and the height position of the outlet is set to be placed between the height position of the center of the lamp 61 and the height position of the upper surface of the transmission window 62 when viewed in the vertical direction (the upward and downward direction in FIG. 4). Furthermore, as illustrated in FIG. 3, the nozzles 64 are also provided to face the circumference of the transmission window 62, so that the cooling fluid G can be supplied to the entire transmission window 62. Further, in this embodiment, the plurality of nozzles 64 are formed to have a nozzle diameter of 4 mm and a length of 25 mm.

As illustrated in FIGS. 4 and 5, a reflector 66 is positioned between the buffer unit 63 and the lamp 61, and is provided to be detachably fixed to the buffer unit 63. In the reflector 66, a plurality of through holes 69b are formed, and the plurality of nozzles 64 are provided in the bottom 63b of the buffer unit 63 through the respective through holes 69b. In other words, the through holes 69b correspond to the plurality of supply ports 69a which are provided in the bottom 63b of the buffer unit 63. The reflector 66 is used to cause the light emitted, when the lamp 61 is turned on, in a direction opposed to the surface of the substrate W to be reflected toward the surface of the substrate W.

As illustrated in FIG. 4, a support member 67 is a member to fix the lamp 61 and the plurality of nozzles 64 to the buffer unit 63. The support member 67 is detachably fixed to the buffer unit 63. Herein, the support member 67 and the lamp 61 are fixed by a fixing tool 67a. In addition, the support member 67 and the plurality of nozzles 64 are fixed by the fixing tool 67a. Further, the support member 67 and the plurality of nozzles 64 may be fixed using an adhesive.

Returning to FIG. 3, a discharge port 68 is used to discharge the cooling fluid G injected from the plurality of nozzles 64 from the lamp chamber 60 to the outside. The discharge port 68 is provided above the lamp chamber 60, but is not limited in position to the upper side of the lamp chamber 60 as long as the position does not affect a process. In addition, a discharge pump (not illustrated) may be connected to the discharge port 68 to keep the discharge amount constant.

The control unit 100 of a control apparatus includes a microcomputer which performs a control focusing on the respective units, and a storage unit which stores substrate processing information on the substrate processing and various types of programs. The control unit 100 controls the conveyance robots 4 and 7, the motors 13 and 33, the arm driving mechanisms 16 and 19, the conveyance doors 22 and 35, the processing solution supply unit 40, the rinse solution supply unit 50, the lamp 61, and the cooling fluid supply unit 70 using the programs.

Next, a substrate processing (a substrate processing method) performed by the above-described substrate processing apparatus 1 will be described. Further, the FOUP 2 storing the unprocessed substrate W is assumed to be in a state of being set in the FOUP placing table 3.

As illustrated in FIG. 1, the conveyance robot 4 moves along the conveyance rail 5, and is positioned to face the FOUP 2 set in the FOUP placing table 3. The conveyance robot 4 takes out the substrate W stored in the FOUP 2, moves along the conveyance rail 5 while holding the substrate, and is positioned to face the substrate placing table 6. Then, the substrate W is placed on the substrate placing table 6 by the conveyance robot 4. Next, the conveyance robot 7 moves along the conveyance rail 8, and is positioned to face the substrate placing table 6. The conveyance robot 7 holds the substrate W placed on the substrate placing table 6, and moves along the conveyance rail 8 while holding the substrate W. The conveyance robot 7 is positioned to face the processing chamber 10 and carries the substrate W into the processing chamber 10.

As illustrated in FIG. 2, the substrate W held by the conveyance robot 7 is placed on the rotation table 11. At this time, the conveyance door 22 is open. The substrate W placed on the rotation table 11 is held such that the eccentrically-rotating holding pin 14 abuts on the end portion of the substrate W. Therefore, the substrate W is rotatably held together with the rotation table 11.

When the substrate W is held in the rotation table 11, an electrical signal is transmitted from the control unit 100 to the motor 13, and the motor 13 is driven to rotate at a predetermined rotation frequency. With the rotational driving, the rotation table 11 and the substrate W are rotated.

Next, in order to process the surface of the rotating substrate W, the processing solution discharge nozzle 18 illustrated in FIG. 2 moves from a retreating position (the standby position) outside the cup 15 to a position (a processing position) in the vicinity of the center of the surface of the substrate W by the arm driving mechanism 16 and the swinging arm 17.

When it is determined that the processing solution discharge nozzle 18 is set to the processing position, the electrical signal is sent from the control unit 100 to the processing solution supply unit 40. Therefore, the processing solution is supplied from the processing solution supply unit 40 to the processing solution discharge nozzle 18. Then, the processing solution is discharged to the surface of the substrate W, and after a predetermined time elapses, the supply of the processing solution from the processing solution supply unit 40 is stopped. Further, when the supply of the processing solution is stopped, the processing solution discharge nozzle 18 moves to the standby position by the arm driving mechanism 16 and the swinging arm 17.

Next, the rinse solution discharge nozzle 21 moves from a retreating position (the standby position) outside the cup 15 to the position (the processing position) in the vicinity of the center of the surface of the substrate W by the arm driving mechanism 19 and the swinging arm 20.

When the rinse solution discharge nozzle 21 moves to the processing position, an electrical signal is transmitted from the control unit 100 to the rinse solution supply unit 50. Therefore, the rinse solution R is supplied from the rinse solution supply unit 50 to the rinse solution discharge nozzle 21. Then, the rinse solution R is supplied from the rinse solution discharge nozzle 21 to the surface of the substrate W, and after a predetermined time elapses, the supply from the rinse solution supply unit 50 is stopped. Herein, when a predetermined time elapses, the rotation frequency of the motor 13 is reduced, and when the supply of the rinse solution R is stopped, the rotation is stopped at almost the same time. In other words, the process is ended in a state where the rinse solution R is spread on the entire surface of the substrate W. Furthermore, when the process of the rinse solution R is ended, the rinse solution discharge nozzle 21 moves to the standby position by the arm driving mechanism 19 and the swinging arm 20. Further, FIG. 2 illustrates a state where the rinse solution R is supplied to the substrate W.

Next, the substrate W in a state where the rinse solution R is spread thereon is carried into the dry processing chamber 30 by the conveyance robot 7. Then, the carried-in substrate W is placed on the rotation table 31 illustrated in FIG. 3. At this time, the conveyance door 35 is open, and the substrate W placed on the rotation table 31 can be held by the holding pin 34 and rotated together with the rotation table 31.

After the substrate W is held to the rotation table 31, the lamp 61 is turned on by the control unit 100, and at the same time the motor 33 is driven to rotate the substrate W. Therefore, the dry processing starts. The dry processing is performed by turning on the lamp 61 to instantaneously increase the temperature of the substrate W. The lamp 61 of this embodiment can increase the temperature of the substrate W up to 100° C. or more in 10 seconds.

Specifically, the light from the lamp 61 is absorbed only by the substrate W, and transmits through the rinse solution R on the surface of the substrate W. Therefore, only the substrate W is heated. Therefore, the substrate W is instantaneously heated, and the rinse solution R in a portion abutting on the surface (including a pattern surface) of the substrate W is gasified to form a gaseous layer. In other words, the gaseous layer (space) is formed between the surface of the substrate W and the rinse solution R. Due to the gaseous layer, the surface tension causes the rinse solution R to adopt a liquid ball shape.

Then, the rinse solution R of the liquid ball shape is blown away from the surface of the substrate W by a centrifugal force of the rotating substrate W. As a result, the substrate W is dried. Then, when a predetermined time elapses, the dry processing is ended, the lighting of the lamp 61 and the rotation of the rotation table 31 are both stopped, and the dried substrate W is carried out of the processing chamber 37 by the conveyance robot 7.

Incidentally, when the above-described dry processing is repeatedly performed, the temperature of the transmission window 62 is gradually increased. This situation is caused by an influence of the lighting of the lamp 61. Since the light from the lamp 61 contains a wavelength absorbed by the transmission window 62, the transmission window 62 is heated. Since the temperature of the transmission window 62 is not lowered at once, the heat is accumulated in the transmission window 62 by the repeated dry processing. It is confirmed that, when this state continues and the dry processing is performed a plurality of times, the temperature of the transmission window 62 becomes 100° C. or more before the lamp 61 is turned on.

Since the transmission window 62 is in a high temperature state, the atmosphere in the dry processing chamber 30 is warmed up and becomes a high temperature environment. After the substrate W spread with the rinse solution R is carried into the dry processing chamber 30 of the high temperature environment (before the substrate W is placed on the rotation table 31), and before the dry processing of the lamp 61 starts, the drying of the surface of the substrate W starts. As a result, it is confirmed that the rinse solution R spread on the surface of the substrate W is unevenly dried so as to cause dry unevenness or a water mark, and thus a defect is caused in the substrate W (collapse of wiring pattern). It is considered that the defect is also caused by an uneven temperature of the transmission window 62 as a whole.

Therefore, in this embodiment, at the same time as the end of the dry processing, or after the end, the cooling fluid supply unit 70 and the valve 71 are controlled by the control unit 100 to supply the cooling fluid G to the buffer unit 63 through the pipe 72. At this time, the lamp 61 is turned off. The cooling fluid G supplied to the buffer unit 63 is injected from the plurality of nozzles 64 toward the transmission window 62. Therefore, the entire transmission window 62 is cooled by the cooling fluid G. Further, the cooling fluid G filled in the lamp chamber 60 is discharged from the discharge port 68 provided in the lamp chamber 60.

Then, when a cooling time of the transmission window 62 elapses, the cooling fluid supply unit 70 and the valve 71 are controlled to stop the supply of the cooling fluid G. When the cooling time elapses, the undried substrate W processed by the processing chamber 10 is newly carried into the processing chamber 37, and the dry processing described above is performed. In this embodiment, a supply time (the cooling time) of the cooling fluid G is set to 50 seconds. This is because a time until the next substrate W is carried into the dry processing chamber 30 after the dried substrate W is carried out of the dry processing chamber 30 is set to 50 seconds. Further, the time may be adjusted.

In the substrate processing apparatus 1 of this embodiment, the plurality of nozzles 64 which directly supply the cooling fluid G to the transmission window 62 are provided in the gap between the adjacent lamps. The cooling fluid G is directly injected from the plurality of nozzles 64 to the transmission window 62 without being blocked by the lamp 61, and thus the transmission window 62 is cooled. In other words, when the substrate W is carried into the processing chamber 37, the temperature of the transmission window 62 is lowered down to a temperature at which the dry unevenness does not occur in the surface of the substrate W. In this embodiment, the transmission window 62 is cooled down to 40 degrees or less.

Therefore, even when the dry processing is repeatedly performed, the high temperature state of the transmission window 62 is prevented from continuing. In addition, it is possible to prevent the environment in the dry processing chamber 30 becoming a high temperature environment.

Accordingly, even when the dry processing is repeatedly performed, the transmission window 62 does not enter the high temperature state (the transmission window is lowered down to the above-described temperature), so that it is possible to prevent the surface of the substrate w being dried in the middle of carrying the substrate W into the dry processing chamber 30. Therefore, it is possible to prevent the occurrence of dry unevenness and water marks due to the unevenly-heated surface of the substrate W. Therefore, pattern collapse is prevented from occurring in products, so that the productivity can be improved.

Further, the injection of the cooling fluid G from the plurality of nozzles 64 may be always performed. In addition, the injection may be performed immediately before the lamp 61 is turned on. Furthermore, instead of performing the injection at the time each dry processing of the substrate W is ended, the cooling fluid G may be injected at every time the dry processing is performed on a predetermined number of substrates W. In this case, the predetermined number of substrates is determined based on a correlation between the number of times of processing acquired through an experiment and the temperature of the transmission window 62.

Second Embodiment

A second embodiment will be described with reference to FIG. 7.

The second embodiment is basically similar to the first embodiment. Therefore, the description in the second embodiment will be made about a difference from the first embodiment, and the same components as those of the first embodiment will be denoted by the same symbols and the description thereof will not be repeated.

A buffer unit 163 illustrated in FIG. 7 includes a main body 163a formed in a cylinder shape and a bottom 163b formed in a circle shape corresponding to the size of the cylinder shape. The lower side of the main body 163a is open, and the open portion is closed by the bottom 163b. Further, the area of the bottom 163b is larger than that of the substrate W. In other words, the side of the buffer unit 163 in a radius direction is large enough to cover the surface of the substrate W.

In the buffer unit 163, a circular shutter 165 is provided above the bottom 163b and in the vicinity of the bottom 163b. The shutter 165 is connected to a rotation mechanism 111 in the buffer unit 163, and can rotate in a direction of arrow F. Further, an opening E of a fan shape, of which the center angle is 45 degrees, is formed in a portion of the shutter 165.

In the rotation mechanism 111, a motor and a rotation shaft (not illustrated) are provided and fixed to the upper portion of the buffer unit 163. In addition, the rotation mechanism 111 is electrically connected to a control unit 100, and controlled in its rotation by the control unit 100. Further, the motor of the rotation mechanism 111 is, for example, a servomotor.

A lamp 61 and a transmission window 62 are provided such that the arrangement and the length thereof correspond to the cylinder shape of the buffer unit 163. Further, the lamp and the transmission window are not limited to the above dimension but may be larger than the dimension corresponding to the buffer unit 163.

In the second embodiment, the buffer unit 163 is formed in the cylinder shape, and the rotatable shutter 165 having the opening E is provided in the buffer unit 163. The cooling fluid G supplied from a supply port 73 is supplied toward the bottom 163b of the buffer unit 163. In this procedure, the cooling fluid G supplied from the supply port 73 is once supplied to the shutter 165, and supplied through the opening E to a supply port 69a at a position facing the opening E. In other words, the cooling fluid G is supplied to a nozzle 64 at a position facing the opening E, and the cooling fluid G is injected from the nozzle 64, so that the transmission window 62 is cooled. Therefore, the second embodiment also has the same effect as the first embodiment. Further, a timing for injecting the cooling fluid G from the nozzle 64 is similar to the first embodiment.

In addition, when the shutter 165 is rotated in a direction of arrow F by the rotation mechanism 111, the opening E moves also. When the rotation mechanism 111 is controlled to be rotated, the nozzle 64 to inject the cooling fluid G to the transmission window 62 is changed among the plurality of nozzles 64. In other words, it is possible to inject the cooling fluid G toward the transmission window 62 while changing a cooling position (injection position) in the transmission window 62. Further, the rotation control may be performed continuously, or may be performed while intermittently repeating rotation and stopping.

In addition, according to this embodiment, since the opening E is provided in the shutter 165, the cooling fluid G can be supplied at a fast flow rate from the plurality of nozzles 64. This is because the cooling fluid expands into the buffer unit 163 when the cooling fluid G is supplied from the supply port 73 into the buffer unit 163, and then the cooling fluid is intensively supplied to the opening E. Therefore, the cooling fluid G having a high flow rate is supplied to the corresponding nozzle 64 through the supply port 69a facing to the opening E. In this way, it is possible to inject the cooling fluid G having a high flow rate from the plurality of nozzles 64 to the transmission window 62. When the flow rate of the cooling fluid G is high, a cooling efficiency of the transmission window 62 is improved and a high temperature atmosphere in the vicinity of the transmission window 62 can be efficiently discharged to the outside of the buffer unit 163. Therefore, it is possible to prevent the inside of a lamp chamber 60 entering the high temperature state.

Third Embodiment

A third embodiment will be described with reference to FIGS. 8, 9A, 9B, 10A, 10B, 11A, 11B, 12A, and 12B.

The third embodiment is basically similar to the second embodiment. Therefore, the description in the third embodiment will be made about a difference from the second embodiment, and the same components as those of the second embodiment will be denoted by the same symbols and the description thereof will not be repeated.

Figure 8:
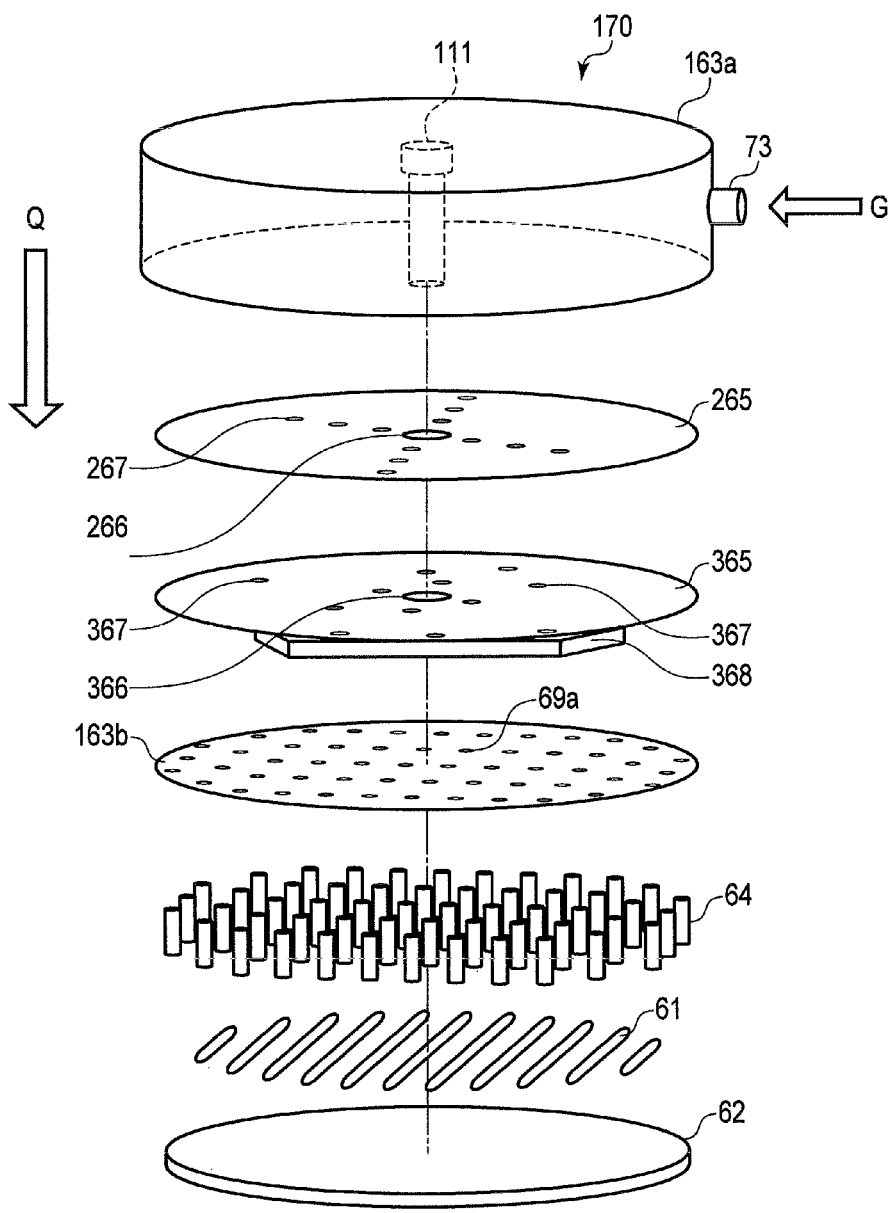
FIG. 8 is an exploded perspective view schematically illustrating a buffer unit of a substrate processing apparatus according to a third embodiment.
Figure 9A:
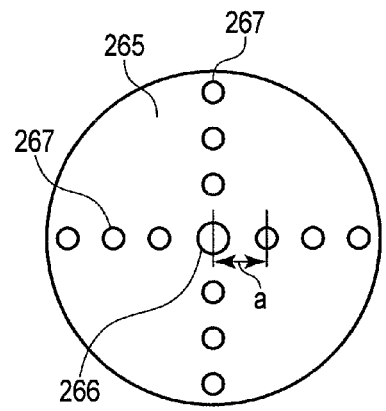
FIG. 9A is a plan view illustrating a configuration of a shutter in the buffer unit of the substrate processing apparatus according to the third embodiment.
Figure 9B:
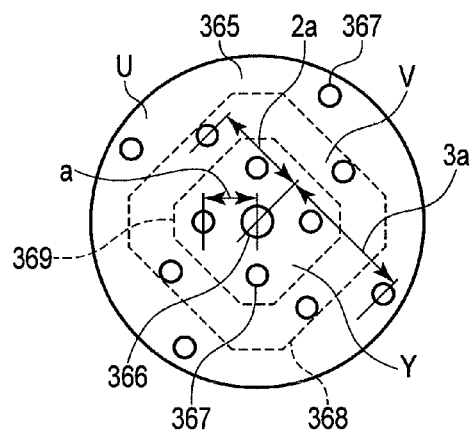
FIG. 9B is a plan view illustrating a configuration of the shutter in the buffer unit of the substrate processing apparatus according to the third embodiment.
Figure 9C:
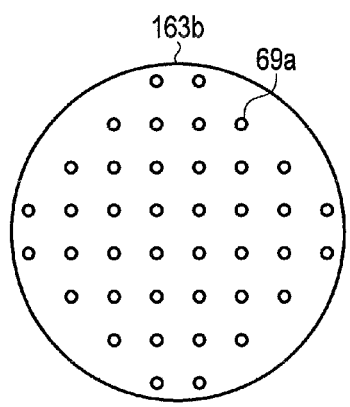
FIG. 9C is a plan view illustrating a configuration of the shutter in the buffer unit of the substrate processing apparatus according to the third embodiment.

As illustrated in FIGS. 8 and 9C, a main body 163a and a bottom 163b forming a buffer 170 are configured similarly to the second embodiment described above. In the buffer 170, a circular shutter 265 (see FIG. 9A) corresponding to the shape of the buffer 170 and a circular shutter 365 (see FIG. 9B) are contained.

In the center of the shutter 265, the through hole 266 is provided where a rotation shaft of a rotation mechanism 111 is bonded. With the rotation mechanism 111, the shutter 265 is rotatably provided. Further, the dimension of the shutter 265 is set to be smaller than the inner diameter of the main body 163a such that it can be rotated in the buffer unit 163. In addition, in the shutter 265, as illustrated in FIG. 9A, supply ports 267 through which the cooling fluid G passes are formed. Further, the respective supply ports 267 are disposed in the shutter 265 such that the ports are arranged on two diameters perpendicular to each other. The supply ports 267 are provided at a distance "a" away from the center of the through hole 266, and an interval between the supply ports 267 is also set to the distance "a" (that is, an equal interval).

In the center of the shutter 365, the through hole 366 is provided through which the rotation shaft of the rotation mechanism 111 passes. In the through hole 366, a bearing (not illustrated) is provided, and the rotation shaft of the rotation mechanism 111 is supported by the shutter 365 by the bearing to freely rotate. The shutter 365 is fixed to the main body 163a. Therefore, the rotation shaft of the rotation mechanism 111 can be rotated. In addition, in the lower surface of the shutter 365, as illustrated in FIGS. 8 and 9B, there are provided an outer partition 368 and an inner partition 369 which are walls continuous in a circumferential direction. With the outer partition 368 and the inner partition 369, there are formed three areas partitioned in the shutter 365 into an outer area U, an intermediate area V, and an inner area Y. Then, in each area, supply ports 367 are formed to serve as holes through which the cooling fluid G passes similarly to the supply ports 267. A distance between the supply port 367 and the through hole 366 provided in the inner area Y is set to the same distance "a" as that between the through hole 266 and the supply port 267. The supply ports 367 provided in the intermediate area V are provided at a position corresponding to a distance "2a" from the center of the through hole 366. In other words, the distance is set to be an interval corresponding to twice the distance between the through hole 366 and the supply port 367 of the inner area Y. The supply port 367 provided in the outer area U is provided at a position corresponding to a distance "3a" from the center of the through hole 366. In other words, the distance is set to be an interval corresponding to three times the distance between the through hole 366 and the supply port 367 of the inner area Y. More specifically, as illustrated in FIG. 9B, the supply ports 367 provided in the inner area Y are provided on the vertical axis and on the horizontal axis about the center of the through hole 366, the supply ports 367 provided in the intermediate area V are provided on axes rotated by 30 degrees from the vertical axis and by 30 degrees from the horizontal axis in the left direction (a direction of arrow M in FIGS. 10A, 11A, and 12A), and the supply ports 367 provided in the outer area U are provided on axes rotated by 60 degrees from the vertical axis and by 60 degrees from the horizontal axis in the right direction (a direction of arrow M in FIGS. 10A, 11A, and 12A).

As illustrated in FIG. 8, the shutter 265, the shutter 365, and the bottom 163b are disposed in this order in a direction of arrow Q. In addition, the outer partition 368 and the inner partition 369 provided in the shutter 365 described above are disposed between the shutter 365 and the bottom 163b.

As illustrated in FIG. 9B, since the shutter 365 is partitioned into three areas of the outer area U, the intermediate area V, and the inner area Y, the supply ports 367 and the supply ports 69a also come to be partitioned in each area.

FIGS. 10A, 10B, 11A, 11B, 12A, and 12B illustrate a positional relation between the shutter 265, the shutter 365, and the bottom 163b when viewed from the direction of arrow Q in FIG. 8. FIGS. 10A to 12B illustrate an appearance in which the rotation mechanism 111 rotates the shutter 265 by 30 degrees in the direction of arrow M. Further, in FIGS. 10A to 12B, the supply ports where the supply ports 267 of the shutter 265 and the supply ports 367 of the shutter 365 are overlapped are illustrated using a solid line (a white circle), and the supply ports where not overlapped are illustrated using a black circle or a broken line.

Figure 10A:
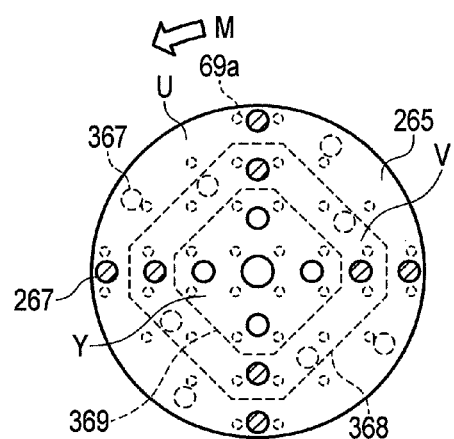
FIG. 10A is a plan view illustrating a configuration in the buffer unit of the substrate processing apparatus according to the third embodiment.
Figure 10B:
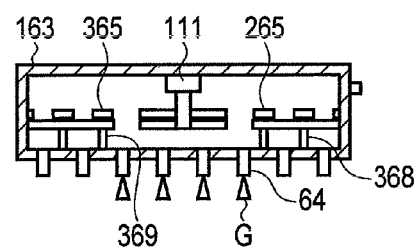
FIG. 10B is a cross-sectional view illustrating a configuration in the buffer unit of the substrate processing apparatus according to the third embodiment.

The positional relation illustrated in FIGS. 10A and 10B illustrates a state when the shutter 265 is at the position of FIG. 9A. The cooling fluid G can pass through the supply ports 267 and the supply ports 367 overlapped with each other. Then, the cooling fluid G passed through the supply ports 267 and the supply ports 367 can be supplied to the supply ports 69a and the plurality of nozzles 64. Herein, since the supply ports 367 overlapped with the supply ports 267 are in the inner area Y partitioned by the inner partition 369, the cooling fluid G is supplied to the supply ports 69a disposed (belonging) in the inner area Y and the nozzles 64 corresponding to the supply ports 69a. Therefore, the cooling fluid G can be supplied to the inside (the center) of a transmission window 62.

Figure 11A:
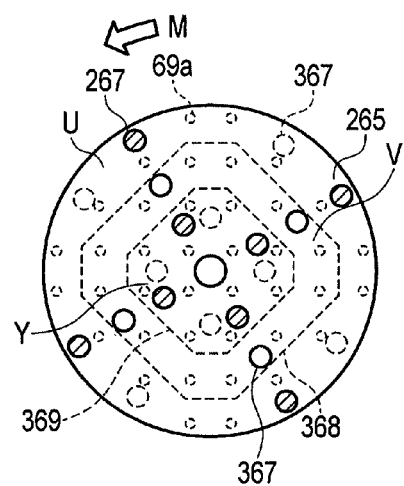
FIG. 11A is a plan view illustrating a configuration in the buffer unit of the substrate processing apparatus according to the third embodiment.
Figure 11B:
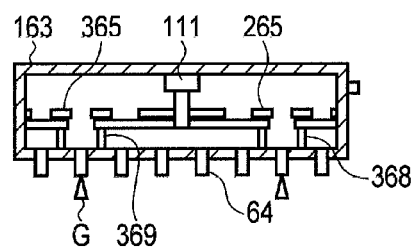
FIG. 11B is a cross-sectional view illustrating a configuration in the buffer unit of the substrate processing apparatus according to the third embodiment.

FIG. 11A illustrates a state when the shutter 265 at the position of FIG. 10A is rotated by 30 degrees in the direction of arrow M, in which the positions (depicted by the solid line) of the supply ports 367 overlapped with the supply ports 267 are changed. In addition, the positions (depicted by the black circle and the broken line) of the supply ports 367 not overlapped with the supply ports 267 are also changed. Since the positions of the supply ports 367 overlapped with the supply ports 267 are in the intermediate area V between the outer partition 368 and the inner partition 369, the cooling fluid G is supplied to the supply ports 69a disposed in the intermediate area V and the nozzles 64 corresponding to the supply ports 69a. Therefore, the cooling fluid G is supplied toward the intermediate portion (an area between the center portion and the outer peripheral portion) of the transmission window 62.

FIGS. 12A and 12B illustrate a state when the shutter 265 at the position of FIG. 11A is further rotated by 30 degrees in the direction of arrow M. In this state, compared to FIGS. 10A, 10B, 11A, and 11B, the positions (depicted by the solid line) of the supply ports 367 overlapped with the supply ports 267 are changed. In addition, the positions (depicted by the black circle and the broken line) of the supply ports 367 not overlapped with the supply ports 267 are also changed. Since the positions of the supply ports 367 overlapped with the supply ports 267 are in the outer area U outside the outer partition 368, the cooling fluid G is supplied to the supply ports 69a disposed in the outer area U and the nozzles 64 corresponding to the supply ports 69a. Therefore, the cooling fluid G is supplied to the outside (the outer peripheral portion) of the transmission window 62.

In this embodiment, when the shutter 265 is rotated in the direction of arrow M in an order of FIGS. 10A, 10B, 11A, 11B, 12A, and 12B, the cooling fluid G is sequentially supplied to the transmission window 62 through the nozzles 64 belonging to the inner area Y, the intermediate area V, and the outer area U. Since the cooling fluid G is supplied as described above, the transmission window 62 is gradually cooled down from inside to outside. Therefore, the second embodiment also has the same effect as the first embodiment. Further, a timing for injecting the cooling fluid G from the nozzle 64 is similar to the first embodiment.

In addition, the transmission window 62 can be cooled down while driving away the high-temperature atmosphere (air) in the peripheral area of the transmission window 62 from the inside of the transmission window 62 to the outside so as to be discharged. In other words, the cooling fluid G can be directly supplied to the transmission window 62 by removing the high-temperature atmosphere in the peripheral area of the transmission window 62. In this way, since the supply port 69a and the nozzle 64 to be supplied with the cooling fluid G are changed as the shutter 265 is rotated, the position to supply the cooling fluid G to the transmission window 62 can be changed. Therefore, since an influence caused by the interference in the cooling fluid G is reduced compared to a case where the cooling fluid G is simultaneously supplied to the entire transmission window 62, the high temperature atmosphere (air) in the peripheral area of the transmission window 62 can be efficiently discharged. Therefore, since the high temperature atmosphere is discharged, and the cooling fluid G is directly injected to the transmission window 62, the transmission window 62 is easily cooled down.

Furthermore, since the cooling fluid G is intensively supplied only through the supply ports 367 overlapped with the supply ports 267, the flow rate is increased. Therefore, since the cooling fluid G of the high flow rate is injected from the nozzle 64, a cooling efficiency of the transmission window 62 is improved, and the high temperature atmosphere (air) in the peripheral area of the transmission window 62 can be efficiently discharged to the outside of the buffer 170, so that the cooling efficiency of the transmission window 62 can be improved.

Fourth Embodiment

A fourth embodiment will be described with reference to FIG. 13.

The fourth embodiment is basically similar to the first embodiment. Therefore, the description in the fourth embodiment will be made about a difference from the first embodiment, and the same components as those of the first embodiment will be denoted by the same symbols and the description thereof will not be repeated.

Figure 13:
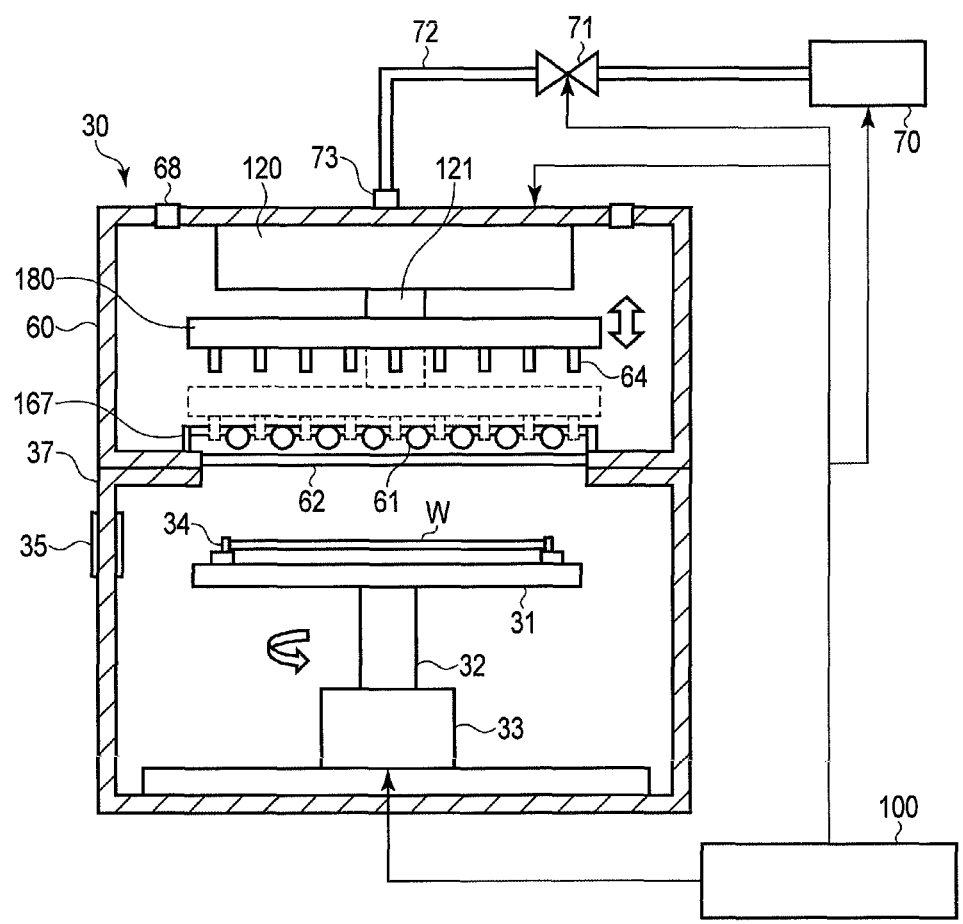
FIG. 13 is a cross-sectional view schematically illustrating a configuration of a dry processing chamber of a substrate processing apparatus according to a fourth embodiment.

As illustrated in FIG. 13, in a dry processing chamber 30 according to the fourth embodiment, a buffer unit 180 provided with a plurality of nozzles 64 is connected to an elevating drive mechanism 120 through an elevating shaft 121. The elevating drive mechanism 120 drives the elevating shaft 121 to cause the buffer unit 180 to move in the upward and downward direction. In other words, the buffer unit 180 can move toward or away from the transmission window 62 by the elevating drive mechanism 120 from a standby position (the solid line) to a processing position (the broken line), and from the processing position to the standby position. Further, in this embodiment, the standby position is a position above the lamp 61 where the nozzle 64 is less affected by the heating of the lamp 61. The processing position is a position where the nozzle 64 goes into the gap between the lamps. In addition, the elevating drive mechanism 120 is electrically connected to a control unit 100, and controlled by the control unit 100. The elevating drive mechanism 120 is configured by, for example, a servomotor. The elevating shaft 121 is, for example, a ball screw. Further, these components may be configured by a linear motor system.

In addition, a pipe (not illustrated) is mounted in the elevating drive mechanism 120 and the elevating shaft 121 to supply the cooling fluid G supplied from a supply port 73 to the buffer unit 180. Further, since the pipe mounted in the elevating shaft 121 is configured to be stretchable, the cooling fluid G may be supplied when the buffer unit 180 goes down from the standby position to the processing position.

The lamp 61 is supported by a support member 167 and fixed in a lamp chamber 60. The support member 167 is provided with the through hole (not illustrated) through which the nozzle 64 passes, and a reflector (not illustrated).

In this embodiment, when the lamp 61 is turned on and the substrate W is subjected to the dry processing, the buffer unit 180 is in the standby state at the standby position. Then, when the lighting of the lamp 61 is stopped, the dry processing of the substrate W is completed, and the substrate W is carried out of a processing chamber 37 by a conveyance robot 7. Thereafter, the elevating drive mechanism 120 and the elevating shaft 121 are driven to cause the buffer unit 180 to move up to the processing position. Then, until an unprocessed substrate W is carried into the processing chamber 37, the cooling fluid G is injected from the plurality of nozzles 64 to cool down the transmission window 62. When the cooling of the transmission window 62 is ended, the buffer unit 180 is moved to the standby position by the elevating drive mechanism 120 and the elevating shaft 121.

As described above, according to the fourth embodiment, the same effect as the first embodiment can be obtained. In addition, since the buffer unit 180 provided with the plurality of nozzles 64 is retreated to the standby position when the lamp is turned on, the influence of the heat on the nozzle 64 at the time when the lamp 61 is turned on is significantly reduced compared to the first to third embodiments. Therefore, it is possible to prevent the nozzle 64 being damaged by the heating and the inside of the nozzle 64 entering the high temperature state.

Further, as a timing for elevating the buffer unit 180 and a timing for injecting the cooling fluid G from the nozzle 64, for example, the buffer unit 180 may be lowered from the standby position to the processing position during the dry processing of the substrate W to cool down the transmission window 62. In addition, a sensor for monitoring the temperature of the transmission window 62 may be provided in the lamp chamber 60. The transmission window 62 may be cooled down based on the sensor.

Fifth Embodiment

A fifth embodiment will be described with reference to FIG. 14.

The fifth embodiment is basically similar to the fourth embodiment. Therefore, the description in the fifth embodiment will be made about a difference from the fourth embodiment, and the same components as those of the fourth embodiment will be denoted by the same symbols and the description thereof will not be repeated.

Figure 14:
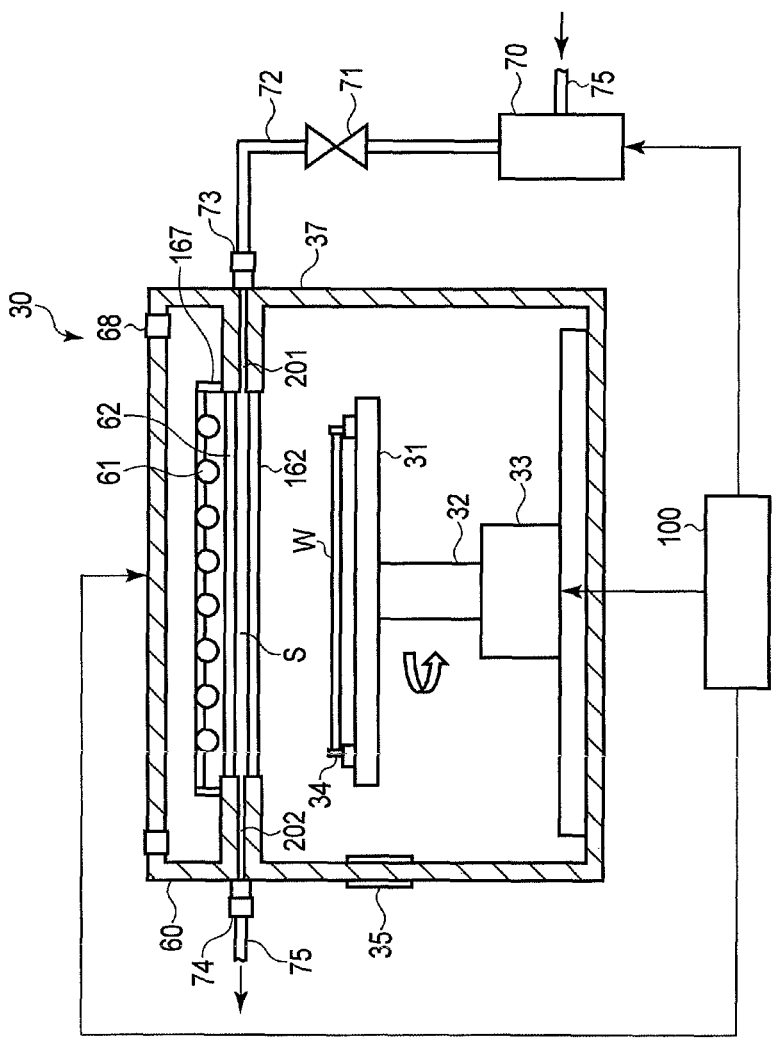
FIG. 14 is a cross-sectional view schematically illustrating a configuration of a dry processing chamber of a substrate processing apparatus according to a fifth embodiment.

As illustrated in FIG. 14, in a dry processing chamber 30 according to the fifth embodiment, a transmission window 162 is provided in the processing chamber 37 besides the transmission window 62 provided in the lamp chamber 60. The transmission window 162 is held above the processing chamber 37 at a predetermined distance which is a predetermined gap with respect to the transmission window 62, and a space S is formed with respect to the transmission window 62. In other words, the transmission window is formed in a two-layer structure with a predetermined space therebetween.

A flow path 201 and a flow path 202 are provided between the processing chamber 37 and the lamp chamber 60. One end of the flow path 201 is connected to a supply port 73, and the cooling fluid G is supplied from a cooling fluid supply unit 70. In addition, the other end of the flow path 201 is connected to the space S. In other words, the space S is configured to be supplied with the cooling fluid G.

One end of the flow path 202 is connected to the space S, and the other end of the flow path 202 is connected to a discharge port 74. Therefore, the cooling fluid G is discharged from the space S through the flow path 202. The discharge port 74 is connected to the cooling fluid supply unit 70 through a pipe 75.

In the fifth embodiment, the transmission window is formed by the two layers of the transmission window 62 and the transmission window 162 to form the space S. The cooling fluid G is supplied to the space S by the cooling fluid supply unit 70 through a pipe 72 and the flow path 201. Then, the cooling fluid G supplied to the space S is returned to the cooling fluid supply unit 70 through the flow path 202 and the pipe 75. In other words, the cooling fluid G is configured to be circulated.

In this way, since the cooling fluid G is supplied to and circulated in the space S formed by the two-layered transmission window, the heat from a lamp 61 is removed, so that it is possible to reduce the heating of the transmission window 162. Therefore, it is possible to prevent the inside of the processing chamber 37 becoming a high temperature environment. Similarly to the first embodiment, it is possible to prevent the dry unevenness and the water mark from occurring when the unprocessed substrate is carried in. Further, a timing for supplying the cooling fluid G to the space S can be set to the same timing as that for discharging the cooling fluid G from the nozzle 64 in the first embodiment.

Further, in the fifth embodiment, as the two-layer structure of the transmission window 62 and the transmission window 162, the space S is provided therebetween, but two or more layers may be provided. In addition, the space S may be not provided by the two-layered transmission window, but a flow path for the cooling fluid G may be provided in the walls of the processing chamber 37 and the lamp chamber 60 so as to cool down the inside of the processing chamber 37 and the lamp chamber 60.

Hitherto, while certain embodiments have been described, these embodiments have been presented by way of example only, and are not intended to limit the scope of the inventions. For example, the configuration described in the fifth embodiment may be combined with the configuration of injecting the cooling fluid from the nozzle to the transmission window described in the first to fourth embodiments. In addition, the above-described embodiments may be embodied in a variety of other forms; furthermore, various omissions substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A substrate processing apparatus to which a processing solution is supplied, comprising:
   a chamber;
   a holding unit which is provided in the chamber and holds a substrate;
   a heating unit which is provided above the chamber to face a surface of the substrate, and heats the substrate held by the holding unit;
   a transmission window which is disposed between the heating unit and the substrate held by the holding unit, and transmits a light emitted from the heating unit;
   a cooling unit which cools down the transmission window using a cooling fluid; and
   a control unit which operates the cooling unit when the heating unit does not perform the heating.

2. The substrate processing apparatus according to claim 1,
   wherein the cooling unit includes
   a cooling fluid injection unit which supplies the cooling fluid toward the transmission window, and
   a cooling fluid supply unit which supplies the cooling fluid to the cooling fluid injection unit.

3. The substrate processing apparatus according to claim 2,
   wherein the cooling fluid injection unit includes
   a plurality of nozzles which are disposed to face the transmission window, and
   a buffer unit which is provided between the nozzles and the cooling fluid supply unit.

4. The substrate processing apparatus according to claim 3,
   wherein the heating unit includes a plurality of lamps which are disposed at a predetermined interval, and
   wherein the nozzles are disposed in a gap between the lamps while outlets of the nozzles face the transmission window.

5. The substrate processing apparatus according to claim 3,
   wherein a shutter is rotatably provided in the buffer unit, and
   wherein the cooling fluid is supplied to the nozzles through an opening provided in a part of the shutter.

6. The substrate processing apparatus according to claim 3,
   wherein two shutters each having a supply port are stacked in the buffer unit, and
   wherein the cooling fluid is supplied to the nozzles through the supply ports overlapped according to a relative rotation of both shutters.

7. The substrate processing apparatus according to claim 2, further comprising:
   a driving unit which causes the cooling fluid injection unit to move toward or away from the transmission window.

8. The substrate processing apparatus according to claim 1,
   wherein a plurality of the transmission windows are provided at a predetermined interval, and wherein a flow path for supplying the cooling fluid is included in a space formed between the transmission windows.

9. A substrate processing method of supplying a processing solution to a surface of a substrate, comprising:
holding the substrate which is contained in a chamber;
heating the substrate, the substrate being held in the chamber, using light transmitted in a thickness direction of a transmission window; and
cooling down the transmission window by supplying a cooling fluid towards the transmission window when the heating of the substrate is not performed.

10. The substrate processing method according to claim 9, wherein the cooling of the transmission window is performed after the heating is ended.

* * * * *